United States Patent [19]

Noda et al.

[11] Patent Number: 5,158,931
[45] Date of Patent: Oct. 27, 1992

[54] METHOD FOR MANUFACTURING AN OXIDE SUPERCONDUCTOR THIN FILM

[75] Inventors: Etsuo Noda, Fujisawa; Setsuo Suzuki, Yokohama; Osami Morimiya; Kazuo Hayashi, both of Tokyo, all of Japan

[73] Assignee: Kabushiki Kaisha Toshiba, Kawasaki, Japan

[21] Appl. No.: 439,388

[22] PCT Filed: Mar. 15, 1989

[86] PCT No.: PCT/JP89/00277

§ 371 Date: Nov. 16, 1989

§ 102(e) Date: Nov. 16, 1989

[87] PCT Pub. No.: WO89/08605

PCT Pub. Date: Sep. 21, 1989

[30] Foreign Application Priority Data

Mar. 16, 1988 [JP] Japan .................. 63-60308

[51] Int. Cl.$^5$ .................. B05D 5/12; B05D 3/06
[52] U.S. Cl. .................. 505/1; 505/732; 505/731; 505/730; 427/62; 427/529; 427/524; 427/576; 427/580; 427/572; 427/584; 427/596; 204/192.24
[58] Field of Search .................. 505/1, 732, 731, 730; 427/62, 63, 45.1, 53.1, 54.1, 126.3, 38, 39, 42; 204/192.24

[56] References Cited

U.S. PATENT DOCUMENTS

| 4,361,114 | 11/1982 | Gurev .................. 118/723 |
| 4,874,741 | 10/1989 | Shaw et al. .................. 505/1 |
| 5,039,657 | 8/1991 | Goldman et al. .................. 505/1 |

FOREIGN PATENT DOCUMENTS

| 57-73178 | 5/1982 | Japan . |
| 63-192857 | 8/1988 | Japan . |
| 63-239151 | 10/1988 | Japan . |
| 63-239742 | 10/1988 | Japan . |
| 64-21973 | 1/1989 | Japan . |
| 64-39783 | 2/1989 | Japan . |
| 64-59729 | 3/1989 | Japan . |

OTHER PUBLICATIONS

Terashima et al., "Single-Crystal YBa$_2$Cu$_3$O$_{7-x}$ Thin Films by activated Reactive Evaporation", Jpn. J. Appl. Phys. 27(1) Jan. 1988 L91–93.
S. Witanachchi et al., "Deposition of superconducting Y-Ba-Cu-O films at 400° C. without post-annealing", Appl. Phys. Lett. 53(3), Jul. 18, 1988.
Jpn. J. Appl. Phys., vol. 26, No. 7, Jul. 1987, Synthesis of Y-Ba-Cu-O Thin Films on Sapphire Substrates by FR Magnetron Sputtering, pp. L1199-L1201.
Denki Joho Tsushin Gakkai Gijutsu Kenkyu Hokoku, vol. 87, No. 137, SCE87-20 [Sankabutsu Ceramics Superconductor Thin Film no Sputtering-ho niyoru Sakusei] pp. 49–54.
Applied Physics Letter 52(9) pp. 754–756, X. D. Wu, et al., Feb. 1988 "Low-temperature preparation of high T$_c$ superconducting thin films".
Applied Physics Letter, 52(4), pp. 320–322, L. Lynds, et al., Jan. 1988, "Superconducting thin films of Y-Ba-Cu-O produced by neodymium:yttrium".
Applied Physics Letter, 51(8), pp. 619–621, D. Dijkkamp et al., Aug. 1987, "Preparation of Y-Ba-Cu oxide superconductor thin films using pulsed laser evaporation from high T$_c$ bulk material".

*Primary Examiner*—Michael Lusignan
*Assistant Examiner*—Roy V. King
*Attorney, Agent, or Firm*—Oblon, Spivak, McClelland, Maier & Neustadt

[57] ABSTRACT

A laser beam 5 is directed to a target made of an oxide superconductor to allow a target spot which is irradiated with the beam to be evaporated and a matter which is evaporated to be deposited as a thin film on the surface of a substrate 3 at which time excited oxygen is supplied to or near a thin film deposition site on the substrate 3. In this way, an oxide superconductor thin film is formed on the substrate with oxygen atoms incorporated in the crystal structure of the thin film.

12 Claims, 11 Drawing Sheets

METHOD FOR MANUFACTURING AN OXIDE SUPERCONDUCTOR THIN FILM

TECHNICAL FIELD

The present invention relates to a method for manufacturing an oxide superconductor thin film as a high-temperature superconductor.

BACKGROUND ART

Conventionally, oxide superconductors including a high-temperature superconductor, such as a Y-Ba-Cu-O system superconductor, are prepared by either thoroughly blending together powdered materials in a proper blend ratio (e.g. Y:Ba:Cu=1:2:3), sintering a resultant blend at high temperature and holding it at high temperature in an oxygen atmosphere or blending together powdered materials and sintering a blend directly at high temperature in an oxygen atmosphere. The oxide superconductor thus manufactured is usually block-like in configuration. In practical application, the oxide superconductor needs to be formed into a wire, a ribbon, a thin film, an element and so on. However, it is substantially not possible to form these products from the aforementioned block-like unit.

In the formation of the ribbon, thin film and element, it is necessary to form a superconductive film on a substrate. This thin-film forming technique includes a plasma CVD, a thermal CVD, a sputtering, laser sputtering, and a technique for coating a slurry, that is a mixture of row materials with a solvent such as water, on a substrate. Various attempts have been made to apply the thin-film forming technique to, for example, various elements. For example, J. Narayan et al. Appl. Phys. Lett. 51(22) PP. 1845(1987) and D. Dijkkamp et al. Appl. Phys. Lett. 51(8) PP 619(1987) disclose a method for forming an oxide superconductor by a laser sputtering in a vacuum atmosphere. In this method, it is necessary to, subsequent to forming a thin film on a substrate, heat-treat it at a temperature as high as above 800° C. in an oxygen atmosphere so that oxygen may be incorporated into a resultant crystal structure. However, there is a risk that the substrate prepared will be broken or oxidized so that it cannot be used in a practical application. Other thin-film forming methods also involves this problem, thus restricting the use of the substrate material in the formation of an oxide superconductor thin film. For example, an epoxy substrate for interconnection, an aluminum ribbon, a semiconductor substrate and an element-formed silicon substrate, upon being exposed to a high-temperature oxygen atmosphere, cannot be employed, failing to prepare an oxide superconductor thin film.

Forming an oxide superconductor thin film on a substrate, if possible, will find an extended application range for the oxide superconductor and offer a step forward to a further practical application.

DISCLOSURE OF THE INVENTION

It is accordingly the object of the present invention to provide a method for forming an oxide superconductor thin film on any substrate available.

A present method for forming a superconductor thin film on a substrate comprises the steps of preparing a substrate, depositing an oxide superconductor thin film on the substrate and supplying excited oxygen to or near a thin film deposition site on the substrate.

According to the present invention, since the excited oxygen is supplied to or near the thin film deposition site on the substrate, an adequate amount of oxygen is incorporated in the thin film deposited. It is, therefore, not necessary to expose the thin film and substrate to an oxygen atmosphere at high temperature. Thus a better oxide superconductor thin film can be formed on the substrate regardless of the kinds of substrates.

BEST MODE OF CARRYING OUT THE INVENTION

Figure 1:
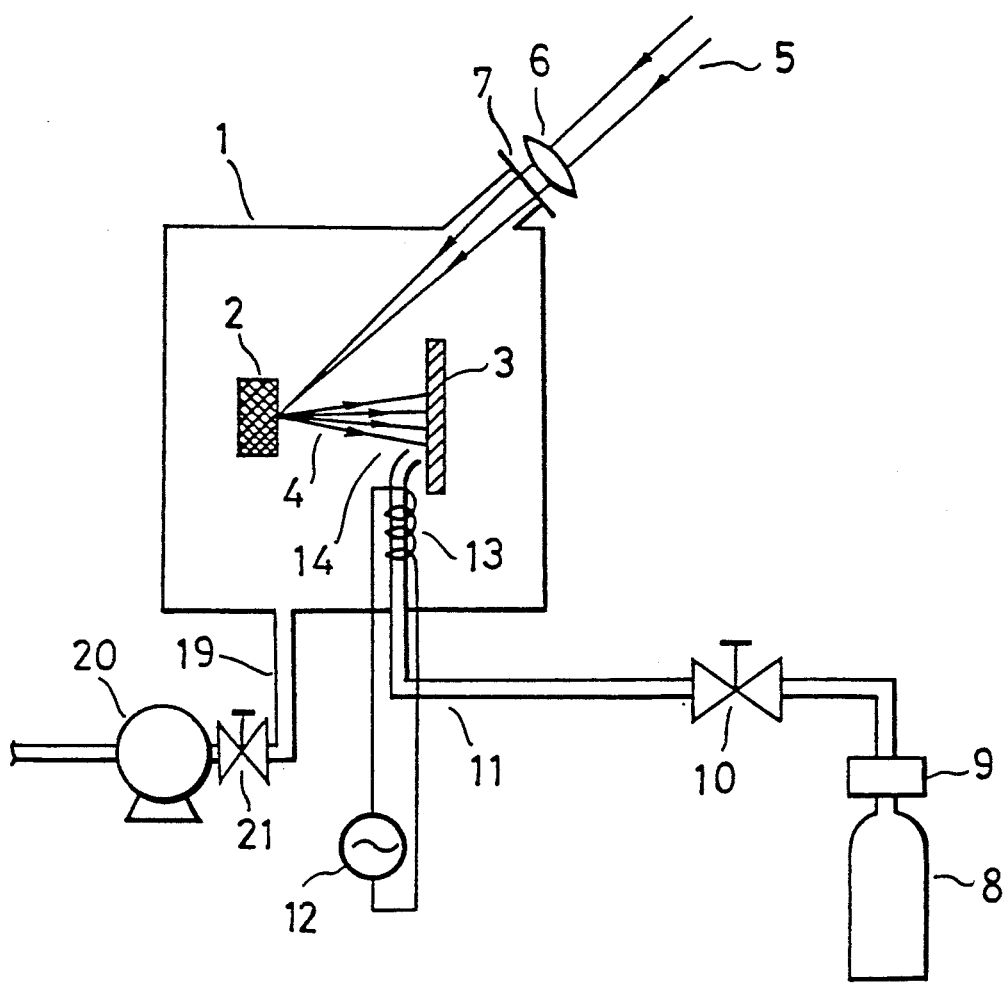
FIGS. 1,2,3,4,5,6,7,8,9,10,11 to 12 are diagrammatic views, each, showing an apparatus for carrying out a method of the present invention.

The present invention will be explained below in more detail.

According to the method of the present invention, an oxide superconductor thin film is deposited on a substrate by supplying activated oxygen toward the thin film deposition site or its neighborhood.

The oxide superconductor thin film may be formed with any conventional oxide superconductors. As the oxide superconductor, use may be made of, for example, an La-Ba-Cu-O system layered perovskite oxide-superconductor (critical temperature: about 40 K or more), a defective perovskite system (critical temperature: about 90 K or more) represented by $LnBa_2Cu_3O_7-\delta$ (Ln denotes at least one kind selected from the group consisting of Y, La, Sc, Nd, Sm, Eu, Gd, Dy, Ho, Er, Tm, Yb and Ln; $\delta$ denotes an oxygen defect of usually 1 or below; and a portion of Ba may be replaced with, for example, Sr), a Bi-Sr-Ca-Cu-O system and a Tl-Ba-Ca-Cu-O system (critical temperature: about 105 K).

Any substrate may be used so long as a thin film can be formed thereon. For example, the substrate used may include not only a heat-resistant substrate such as ceramics and glass, but also a non-heat-resistant substrate such as an epoxy substrate for interconnection, aluminum ribbon, semiconductor substrate and element-formed silicon substrate. The substrate can take various forms, such as a sheet, wire and sphere, according to use which it is put to.

The way of depositing an oxide superconductor thin film on a substrate may be done by any thin-film forming method, but the following methods are preferable; a beam sputtering method for irradiating a target with a laser beam, electron beam, ion beam or neutral particle beam to allow an irradiated target portion to be evaporated, sublimated or activated into a plasma phase for deposition on a substrate; a CVD method such as a plasma CVD, light CVD and a thermal CVD; and a beam deposition method for depositing an oxide superconductor on a substrate with the use of a beam such as an ion beam, a neutral particle beam, a molecular beam, a cluster beam and cluster ion beam.

In the case of forming a thin film on the substrate by the beam sputtering method, a target needs only to contain constituent elements of which the oxide superconductor is composed. That is, the target may be composed of an oxide superconductor only or row materials for the oxide superconductor component. As an oxide superconductor source, use may be made of one or more targets.

The way of supplying excited oxygen to or near a thin film deposition site is not particularly restricted according to the present invention. For example, oxygen may be supplied as an excited one in a radio-frequency discharge to the aforementioned site or an oxygen-containing gas may be delivered to the deposition site. Furthermore, an oxygen gas or an oxygen-containing gas may be supplied into a thin film deposition apparatus to fill it with the gas in which case it is excited by a high-frequency discharge or a thin film deposition site or its neighborhood may be irradiated with an ultraviolet radiation, vacuum ultraviolet radiation, visible radiation, infrared radiation or so on.

Here the excited oxygen may be an atomic oxygen, ozone excited oxygen molecule, oxygen molecule ion, oxygen atom ion etc. singly or in combination therewidth.

The substrate temperature upon the formation of a thin film on the substrate is not set to a particular level and may be determined depending upon the kinds of substrates used. According to the present invention, a better thin film can be formed at an ordinary temperature on the substrate, but there is a tendency of the thin film to have much better characteristic at a higher substrate temperature. It is, therefore, better to set the substrate in a higher temperature range within which no bad effect is exerted upon the substrate used. Even in this case, it is not necessary to increase the substrate above 650° C.

An oxide superconductor thin film, being formed by such a method on the substrate, reveals a better superconductive characteristic and it is not necessary to conduct a heat treatment subsequent to the formation of the thin film. In the conventional method, since no adequate superconductor thin film is obtained due to oxygen evolved from the thin film during film formation, it is necessarily required that a heat treatment be carried out in an oxygen atmosphere. According to the present invention, excited oxygen is supplied to the thin film deposition site or its neighborhood, allowing an adequate amount of oxygen to be incorporated into the thin film. It is thus possible to obtain a better superconductor thin film without the need to conduct a heat treatment in the oxygen atmosphere.

Embodiments of the present invention will be explained below.

First, a first embodiment of the present invention will be explained below. The first through third embodiments of the present invention are directed to depositing a thin film on a substrate by means of a beam sputtering method.

FIG. 1 is a diagrammatic view showing an apparatus which is applied to the first embodiment of the present invention. Within an evaporation chamber 1, a substrate 3 is set opposite to a target 2 made of an oxide superconductor or a raw material for the oxide superconductor. If the target 2 is made of row materials containing constituent elements for the oxide superconductor, a mixture of power-like row materials in a proper ratio (for example, the ratio of yttrium, barium and copper is 1:2:3) or a sintered body made by sintering the mixture can be used.

A beam entry window 7 is provided at the top wall of the evaporation chamber 1 and laser beam 5 is output to a beam generation source, not shown, which is located outside the evaporation chamber 1. The laser beam is focused by a lens 6 onto the target 2 via the beam entry window 7. A sputtering vapor 4 is emitted from an irradiated portion on the target 2. As that time, the laser beam 5 may be either pulse-like or continuous.

An exhaust pipe 19 is provided at the bottom wall of the evaporation chamber 1 such that it is connected via a valve 18 to an exhaust pump 20 by which the interior of the evaporation chamber is exhausted to a desired vacuum level.

One end of a pipe 11 is connected to the bottom of the evaporation chamber 1 and a nozzle 14 for jetting excited oxygen extends into the neighborhood of the substrate 3. The other end of the pipe 11 is connected to a gas container 8 which contains oxygen, a mixture of oxygen and a gas such as a rare gas, or gas containing an oxygen compound evolving excited oxygen when it is subjected to a discharge or light irradiation. The gas in the gas container 8 is supplied via the pipe 11 to the substrate surface 3. A pressure-reducing valve 9 is provided relative to the container 8 and a valve 10 is provided partway of the pipe 11.

A coil 13 is mounted around that portion of the nozzle 14 which is located near the substrate 3. A radio frequency (RF) power supply 12 is connected to the coil 13.

An oxide superconductor thin film is formed on the aforementioned apparatus as will be set forth below. First the interior of the evaporation chamber 1 is vented by the pump 20 and an oxygen gas or its gas mixture is supplied from the container 8 to the substrate 3 via the pipe 11 and nozzle 14. Then the beam 5 is directed to the target 2, causing the sputtering vapor 4 to be given off. By so doing, the vapor 4 is deposited on the surface of the substrate at which time the gas being supplied toward the substrate is discharged with the power source 12 ON and hence the coil 13 energized. The oxygen gas being supplied toward the substrate is activated by such a discharge into one of, for example, atomic oxygen, ozone, excited oxygen molecule, oxygen molecule ion and oxygen atom ion or into a mixture thereof. As a result, oxygen atoms are incorporated into a deposited thin film crystal structure to form an oxide superconductor thin film on the substrate 3.

At that time, the pressure in the evaporation chamber 1 may be above $10^{-5}$ Torrs, preferably in a range of 0.1 to 1000 m Torr and more preferably about 1 to 100 m Torr.

Figure 2:
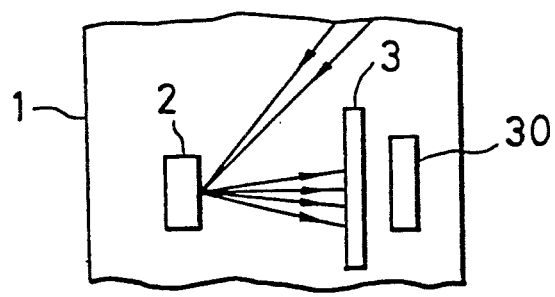

As set forth above, the substrate temperature during a thin film deposition step is not particularly limited but, if the substrate needs to be heated, a heater 30 may be provided near the substrate 3 as shown in FIG. 2.

The excited oxygen can be obtained utilizing not only the aforementioned RF discharge but also a DC discharge, AC discharge and microwave discharge.

According to the present invention it is possible to use not only a electrodeless discharge using the aforementioned coil, etc. as well as a discharge using electrodes, silent discharge, microwave discharge using a waveguide, and electron cyclotron resonance. The discharge as set out above may be continuous or, if the beam 5 for irradiation is pulse-like, a discharge may be developed in synchronization with the pulse.

Figure 3:
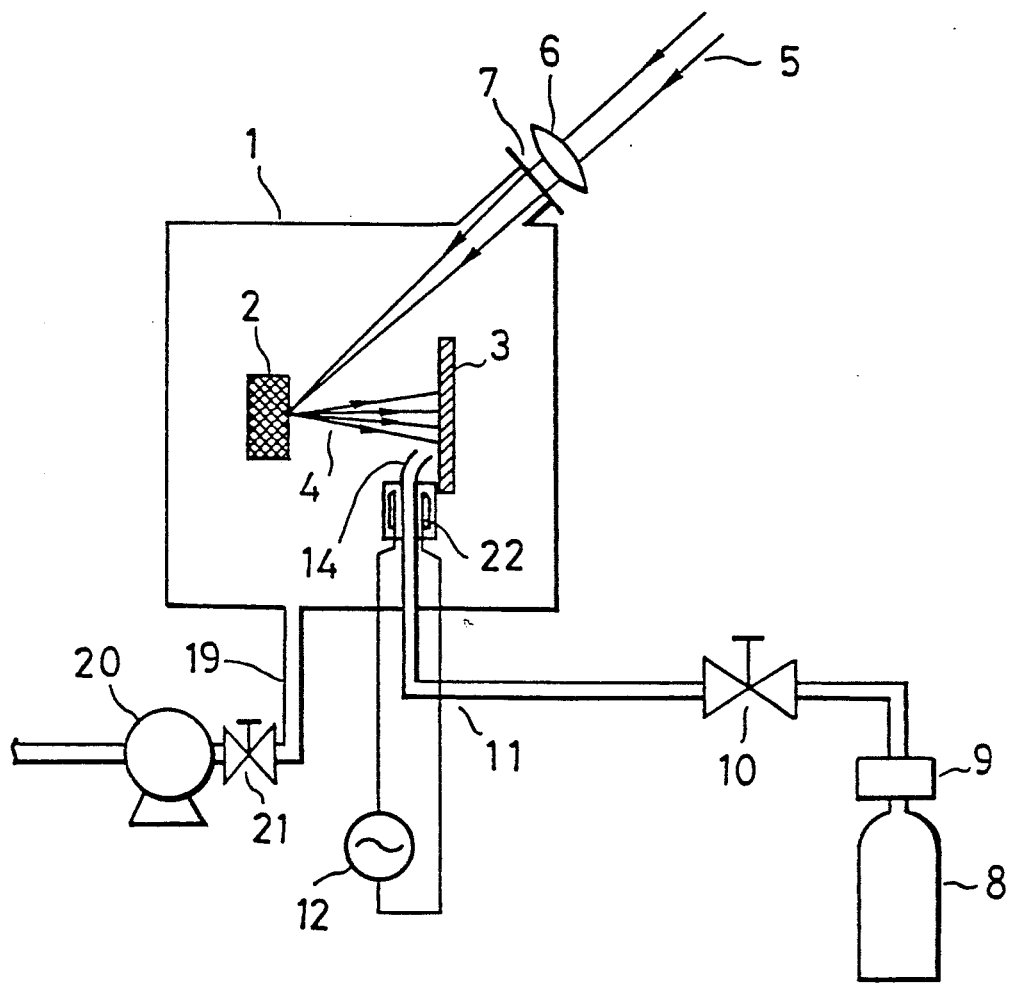

FIG. 3 shows a thin film manufacturing apparatus which evolves excited oxygen by aforementioned silent discharge. The apparatus of FIG. 3 is the same as that of FIG. 1 except that the coil 13 of FIG. 1 is replaced with an electrode 22 covered with a dielectric. If a pipe 11 is made of a dielectric such as glass, then it is not necessary to provide the dielectric around the electrode.

Figure 4:
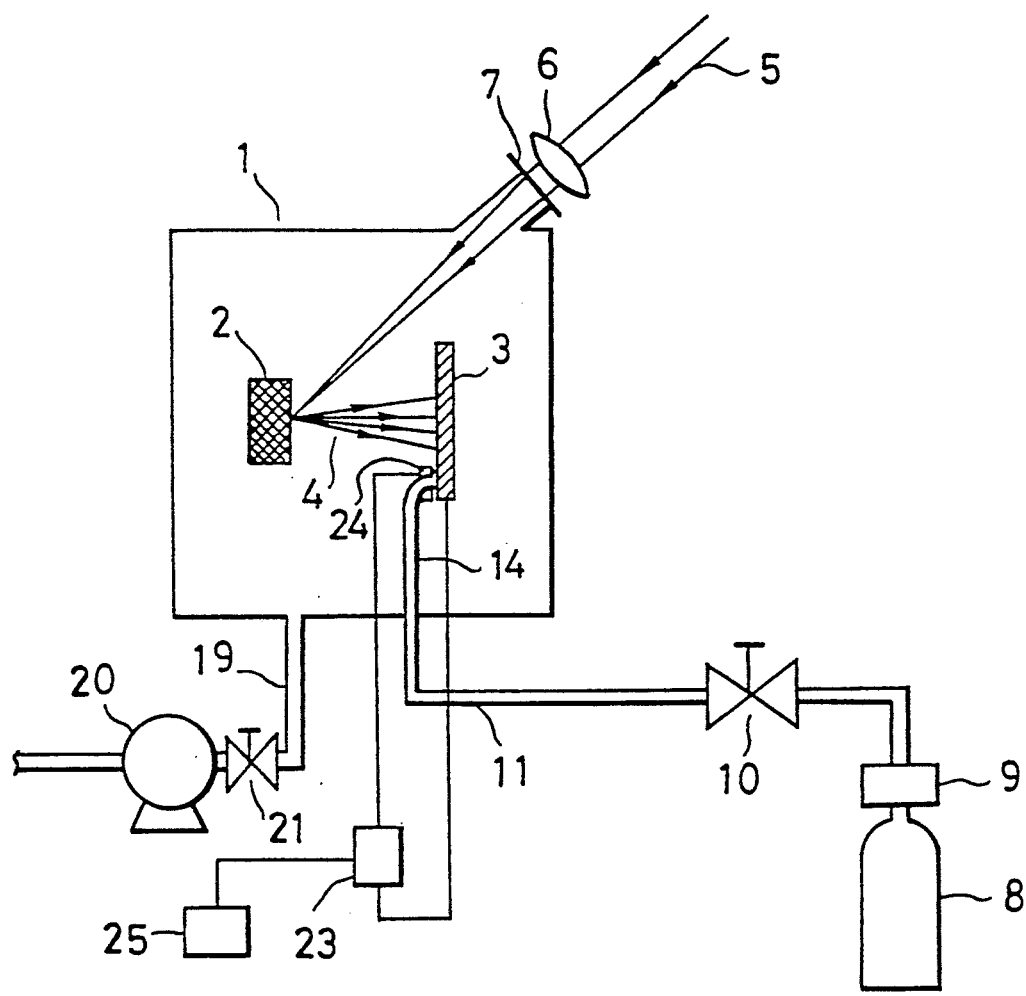

FIG. 4 shows a thin film manufacturing apparatus of a type in which activated oxygen is evolved by a pulse-like DC discharge. The apparatus is different from the apparatus of FIG. 1 except for an activated oxygen generating mechanism alone. That is, an electrode 24 is provided near a substrate 3 and a DC power supply 23 is connected between the electrode 24 and the substrate whereby a discharge occurs between the electrode 24 and the substrate 3. A trigger is supplied from a trigger device 25 to the DC power supply 23 such that it synchronizes with a pulse cycle of a beam 5. The trigger signal from the trigger device 25 may be delivered simultaneously with an irradiation beam pulse or either a little before or a little after the irradiation beam pulse.

Figure 5:
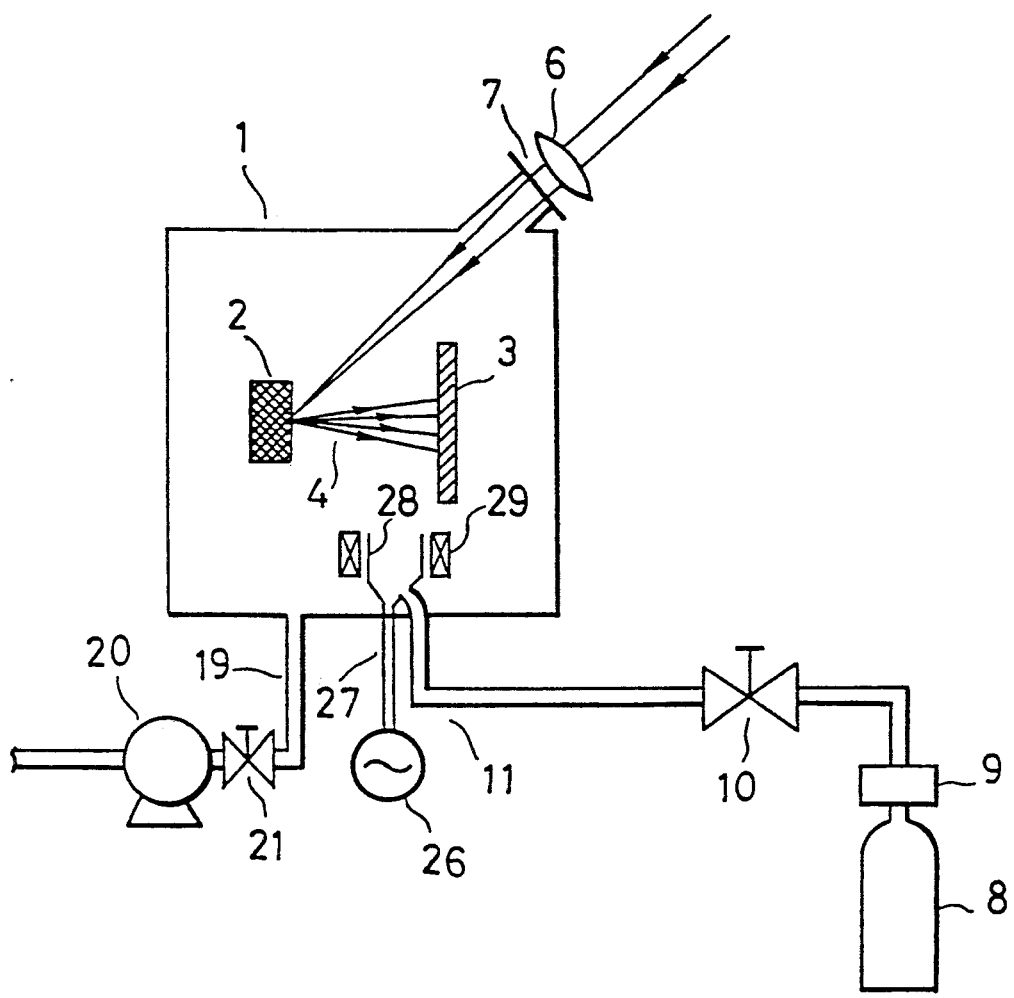

FIG. 5 shows a thin film manufacturing apparatus of such a type that excited oxygen is generated by a microwave's discharge resulting from an electron cyclotron resonance. The apparatus of FIG. 5 is also different from that of FIG. 1 except for an activated oxygen generation mechanism alone. That is, a microwave power supply 26 is provided below a deposition chamber 1 and a waveguide 27 is connected to the power supply 26 such that it extends to the bottom of the deposition chamber 1. A discharge tube 28 is located on the bottom of the deposition chamber 1 in a manner to be continuous with the waveguide 27. A coil 29 is provided around the discharge tube 28. A pipe 11 for oxygen gas supply is connected to the discharge tube 28 to supply an oxygen gas into the discharge tube 28. In this case, the power supply 26 is operated, for example, in an oxygen gas stream in the discharge tube 28, generating a microwave's discharge in the discharge tube 28 and hence excited oxygen. The excited oxygen is supplied to a thin film deposition surface of a substrate 3. The coil 29 can be replaced with other magnetic field generators, such as a permanent magnet.

Figure 6:
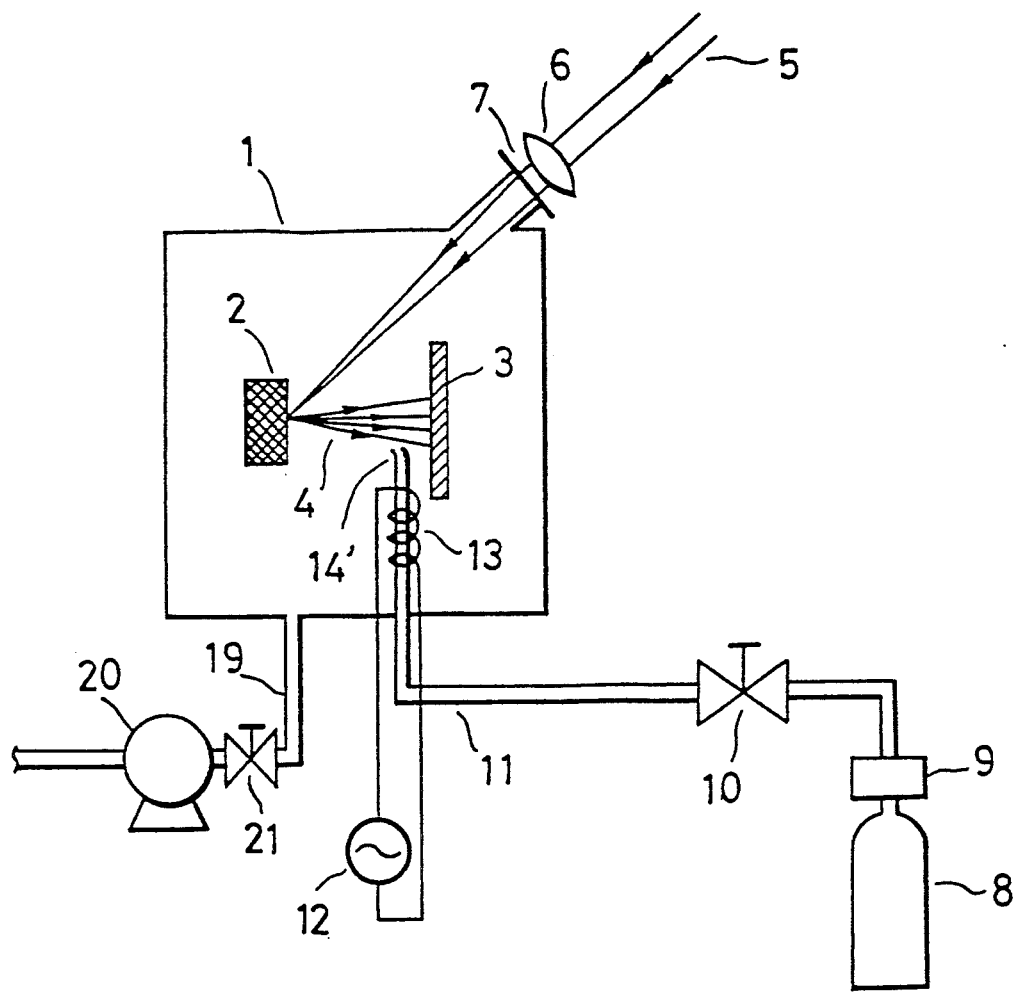

Although, in the apparatus of FIGS. 1, 3 and 4, the activated oxygen have been explained as being supplied to the thin film deposition surface of the substrate 3 via the nozzle 14, a similar advantage can also be gained even if excited oxygen is supplied by a nozzle 14' into a space zone where sputtering particles fly about as shown in FIG. 6.

A second embodiment of the present invention will now be explained below.

Figure 7:
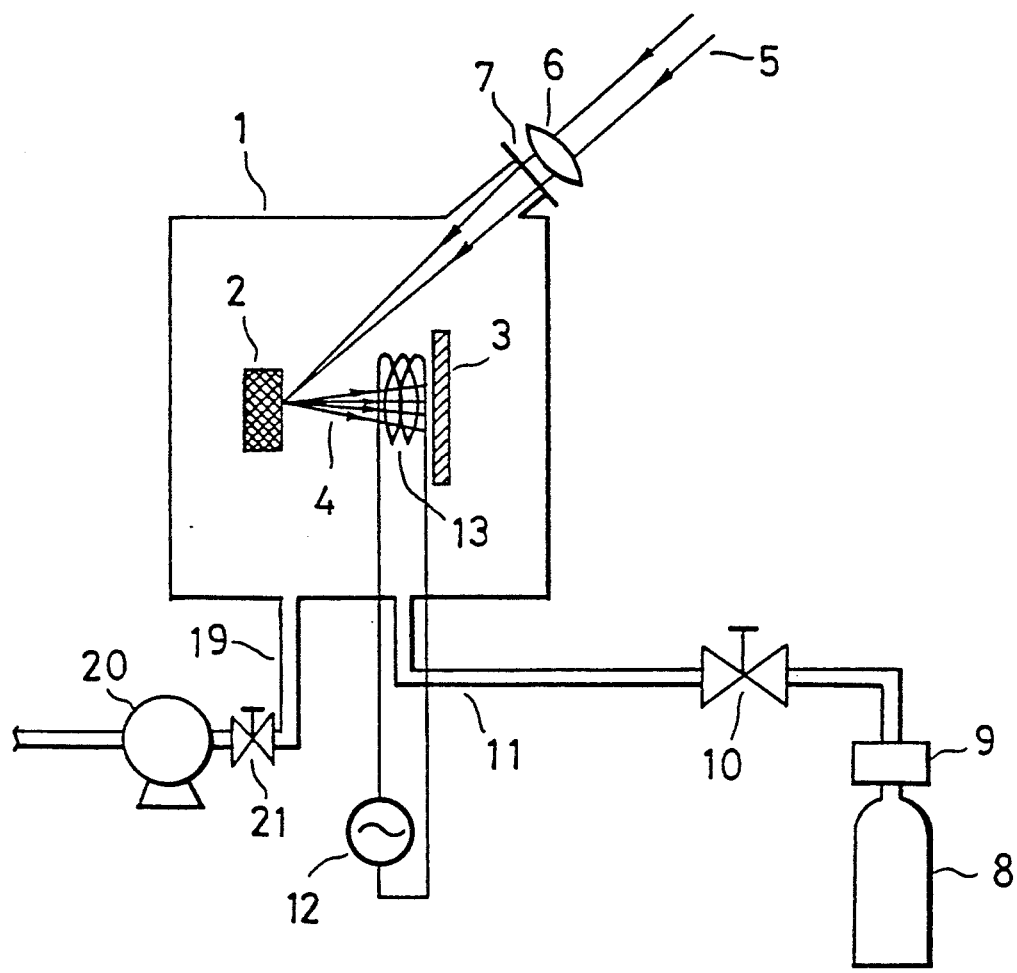

FIG. 7 is a diagrammatic view showing an apparatus according to the second embodiment of the present invention. This apparatus is the same as that of FIG. 1 except that there exists no nozzle. Here, the way of supplying excited oxygen is different from that according to the first embodiment of the present invention. That is, in the apparatus shown in FIG. 1, a coil 13 is energized to develop a discharge in an oxygen gas or an oxygen-containing gas of proper pressure in a deposition chamber 1. By so doing, excited oxygen is developed in the neighborhood of a substrate 3 and supplied to a thin film deposition surface of the substrate 3 or near it. As a result, oxygen atoms are incorporated into a crystal structure of a resultant thin film to form an oxide superconductor thin film.

Various means can be used as in the first embodiment so as to develop a discharge.

A third embodiment of the present invention will be explained below.

Figure 8:
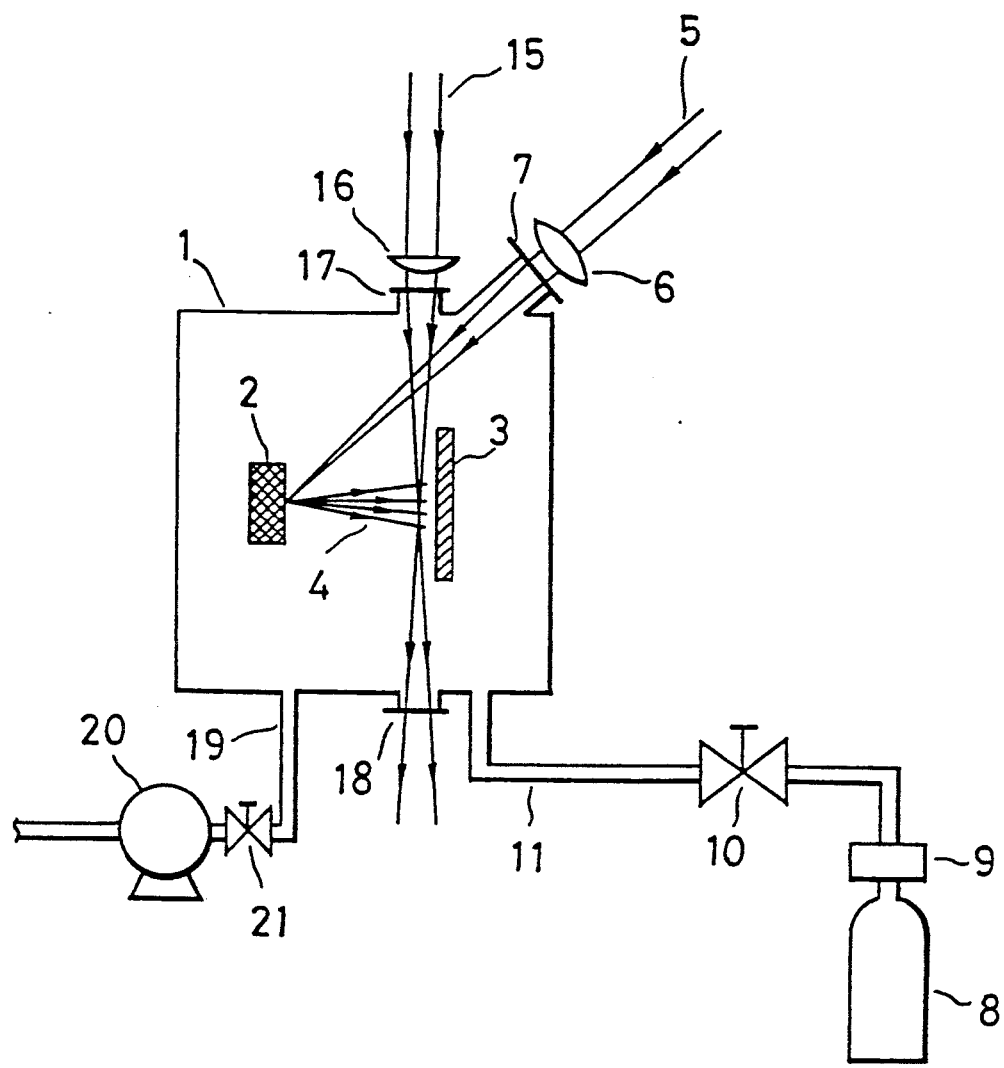

FIG. 8 is a diagrammatic view showing an apparatus according to a third embodiment of the present invention. In the apparatus of FIG. 8, a way of forming excited oxygen is different from those as set forth in connection with the first and second embodiments.

In the apparatus shown in FIG. 8, windows 17 and 18 are formed in the top and bottom walls of a deposition chamber 1, respectively, such that they are located opposite to each other. A light source (not shown) is located at the top wall of the deposition chamber 1 and an ultraviolet laser beam 15 coming from the light source is focused via a focusing lens 15 and window 17 toward the neighborhood of a thin film deposition site on a substrate 3. Thereafter, the beam diverges and goes out of the deposition chamber 1 via the window 18.

When an ultraviolet laser beam 15 is directed into the deposition chamber 1 filled with an oxygen gas or oxygen-containing gas under a proper pressure level as set out above, then the oxygen is excited in the neighborhood of the substrate 3 where the laser beam is focused. The excited oxygen is supplied to the thin film deposition site on the substrate 3. The oxygen atoms are taken into a thin film crystal structure.

An ultraviolet lamp may be used in place of the ultraviolet laser beam to excite oxygen. As the beam, use may be made of a vacuum ultraviolet beam whose wavelength is nearly below 2000Å, as well as a visible beam and ultraviolet beam, to excite oxygen.

Although the ultraviolet beam has been explained as being directed toward the neighborhood of the substrate, it may be directed to the surface of the substrate. Furthermore, the ultraviolet beam not necessarily need to be focused toward the neighborhood of the substrate.

When the beam 5 is directed toward the target 2 with an irradiation energy of above $10^7$ to $10^8$ W/cm$^2$, the target 2 is activated into a plasma phase, producing a strong ultraviolet beam or X-ray. Thus excited oxygen can be produced by an ultraviolet beam or X-ray.

In the second and third embodiments of the present invention, the pressure of an $O_2$ gas in the deposition chamber 1 may be $10^{-5}$ Torr, but is preferably in a range of 0.1 to 1000 m Torr or more preferably in a range of nearly 1 to 100 m Torr.

A fourth embodiment of the present invention will be explained below. The fourth to sixth embodiments of the present invention will be explained below in connection with depositing a thin film on the substrate by a CVD method.

Figure 9:
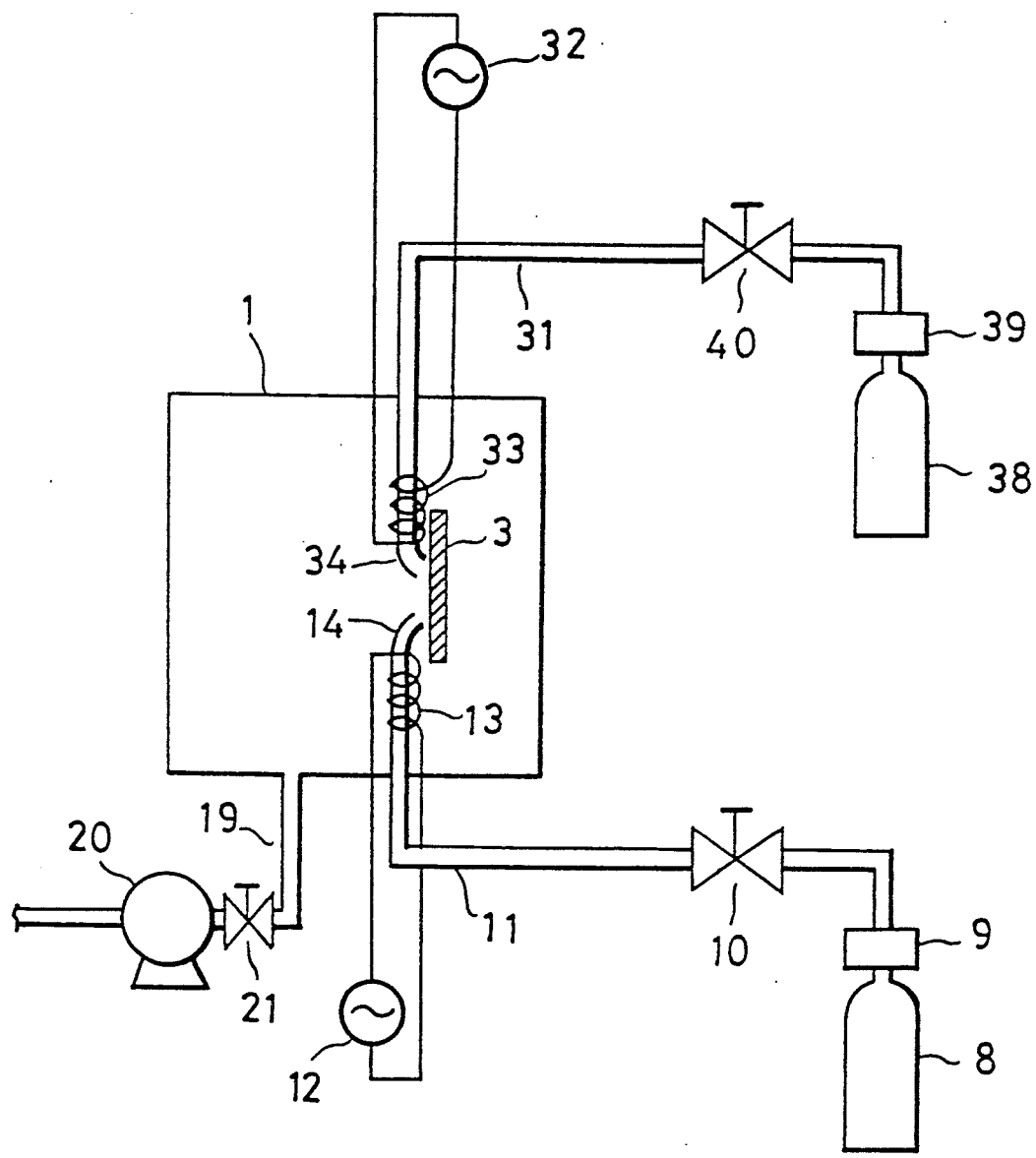

FIG. 9 is a view showing an apparatus which is applied to the fourth embodiment. In the arrangement shown in FIG. 9, a deposition chamber 1, exhaust system, oxygen gas supply system and excited oxygen-forming means are given the same reference numerals employed to designate parts or elements corresponding to those shown in FIG. 1, and not explained.

One end of a pipe 31 is connected to the top surface of a deposition chamber 1 and a gas jet nozzle 34 is connected to the pipe 31 such that it extends toward the neighborhood of a substrate 3. A gas container 38 which is held with a feed gas of an oxide superconductor is connected to the other end of the pipe 31. A gas in the gas container 38 is supplied to the substrate 3 via the pipe 31. A vacuum valve 39 is provided for the container 39 and a valve 40 is provided for the pipe 31.

A coil 33 is provided around that portion of the nozzle 34 which is situated near the substrate 3. An RF power supply 32 is connected to the coil 33.

In the formation of an oxide superconductor thin film by the aforementioned apparatus, air in the deposition chamber 1 is exhausted by a pump 20 and, with electric current flowing from the power supply 32 to the coil 33, a feed gas for oxide superconductor is supplied from the container 38 via the pipe 31 and nozzle 34 onto the surface of the substrate 3. Upon the flowing of electric current through the coil 33, a discharge occurs in the feed gas, causing the feed gas to be excited to allow a corresponding thin film to be deposited on the substrate.

Like the apparatus shown in FIG. 1, the oxygen gas or its mixed gas which is jetted from the nozzle 14 is excited with electric current flowing through the coil, supplying it to a thin film deposition site on the substrate 3. As a result, oxygen atoms are incorporated into a crystal structure of a resultant thin film on the substrate 3. It is thus possible to obtain an oxide superconductor thin film.

The supply of the feed gas for oxide superconductor and that of an oxygen gas may be alternately or simultaneously carried out.

As a discharging method used in the production of excited oxygen, the various methods as set out above can be employed, such as a DC discharge or AC discharge. Even in the excitation of the feed gas, various discharging methods can be used as in the case of producing excited oxygen. The aforementioned excitation can be achieved using a light beam and heat.

As the feed gas for oxide superconductor, organometallic gas is preferable, but the present invention is not restricted thereto. Any material may be used so long as it can be employed as a feedstock for an oxide superconductor. The pressure in the deposition chamber 1 is held in a value range as set forth in the first to third embodiments.

A fifth embodiments of the present invention will be explained below with reference to FIG. 10.

Figure 10:
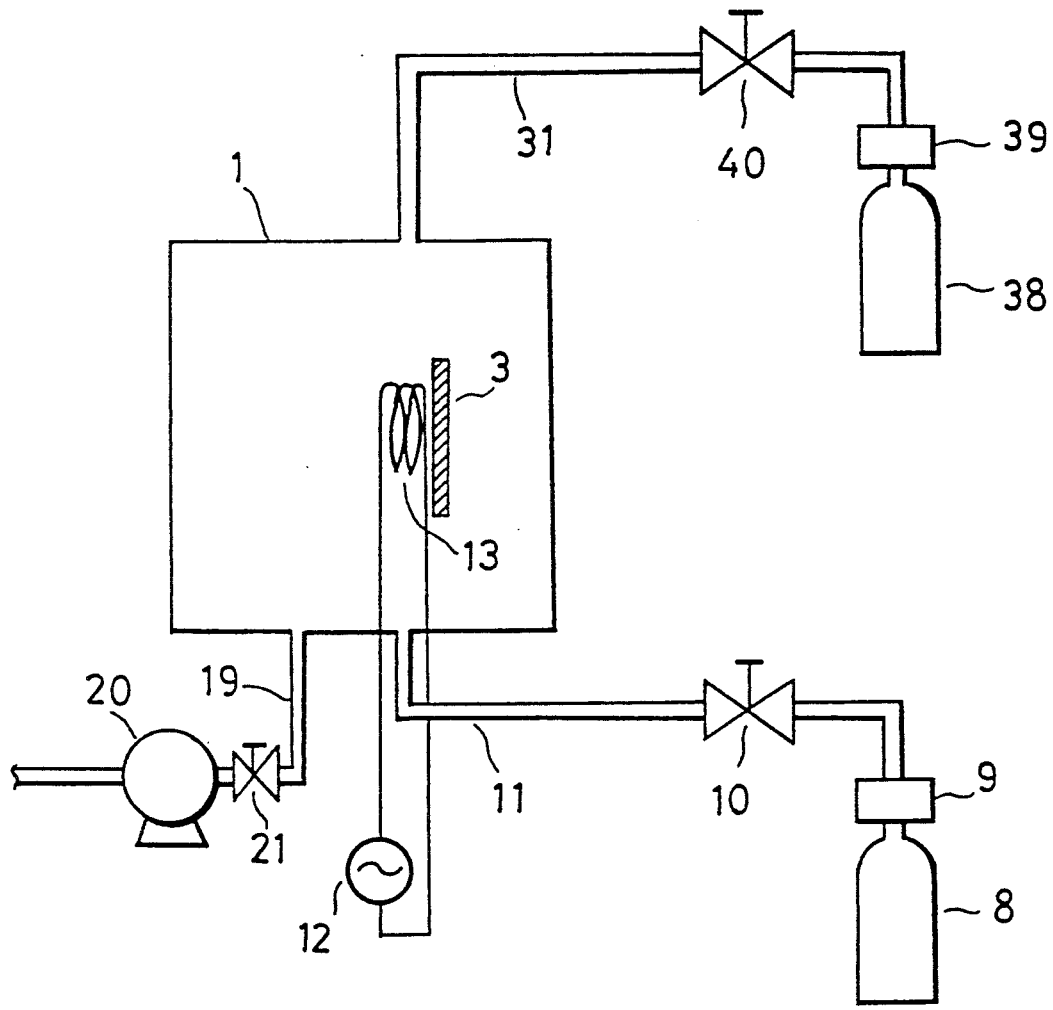

FIG. 10 is a view showing a diagrammatic arrangement of an apparatus according to a fifth embodiment of the present invention. This apparatus is different from that according to the fourth embodiment in the way of supplying excited oxygen. Here, a feed gas for oxide superconductor is supplied from a container 38 via a pipe 31 into a deposition chamber 1 under a proper pressure, while on the other hand a discharge is produced near a substrate 3 with electric current flowing through a coil 13. By doing so, thin film is deposited on the surface of the substrate.

After a predetermined period of time following the production of a discharge, the feed gas for oxide superconductor is evacuated by a pump 20 and an oxygen gas or mixed gas is supplied from the container 8 via the pipe 11 into the deposition chamber 1 and held in the deposition chamber under a proper pressure. The feed gas is excited due to production of a discharge in the neighborhood of the substrate resulting from a flow of electric current through a coil 13. In this way, excited oxygen is supplied to a thin film deposition spot on the substrate 3. As a result, oxygen atoms are incorporated into a crystal structure of a resultant thin film to form an oxide superconductor thin film on the substrate.

An oxide superconductor thin film of a required thickness can be formed on the substrate by repeating the aforementioned two steps a proper number of times.

The alternate supply of the aforementioned feed gas and oxygen gas is preferable from the standpoint of preventing a possible bad effect caused by a reaction of the oxygen gas with the feed gas. The feed gas and oxygen gas, if being in coexistence, may simultaneously be introduced into the deposition chamber and excited there.

Even in this embodiment, it is possible to employ the aforementioned discharge means.

A sixth embodiment of the present invention will be explained below with reference to FIG. 11.

Figure 11:
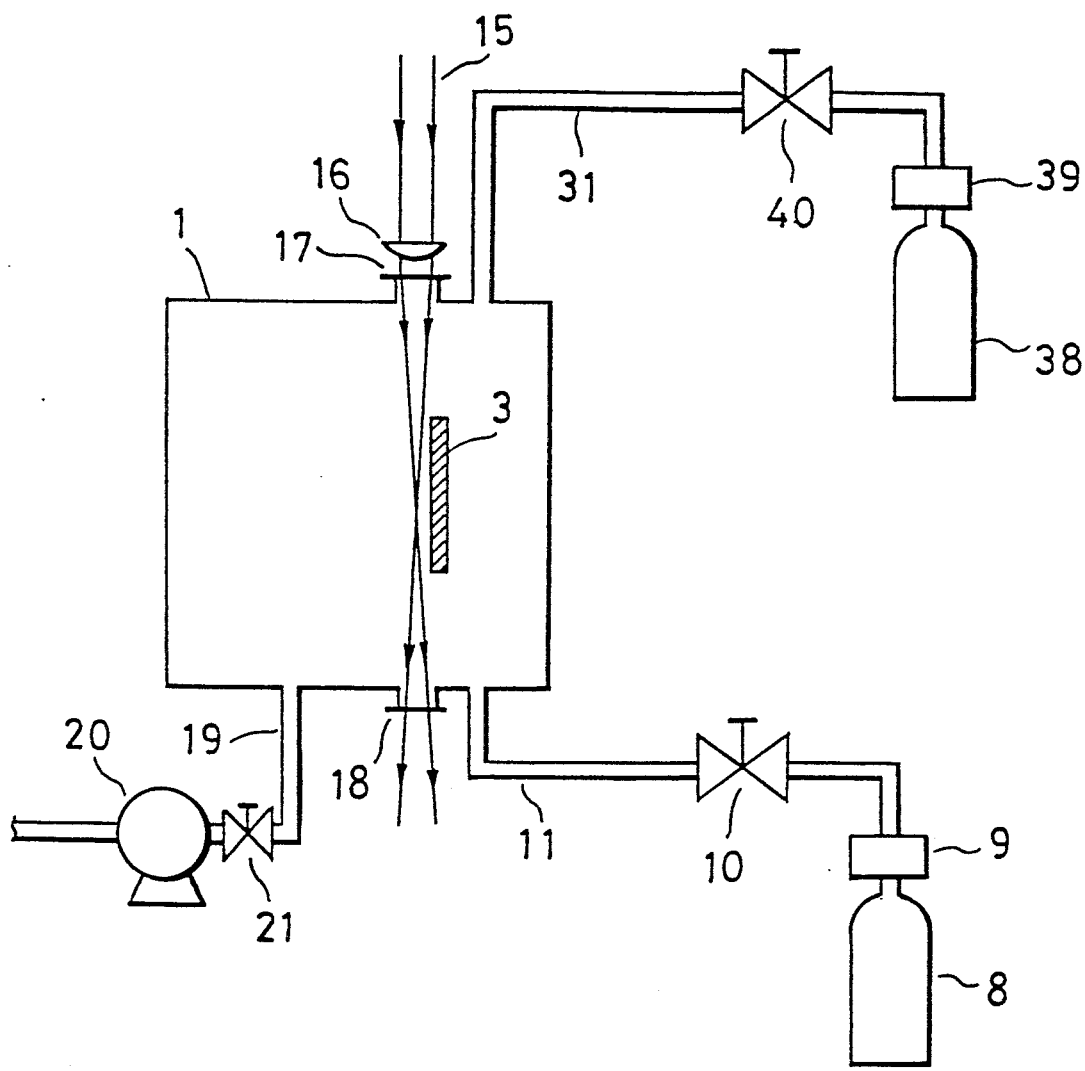

FIG. 11 is a view diagrammatically showing an apparatus according to the sixth embodiment of the present invention. This apparatus is different from those as set forth in connection with the fourth and fifth embodiments of the present invention, in respect of forming excited oxygen. In the apparatus shown in FIG. 11, a deposition chamber 1 has mutually opposite windows 17 and 18 at the top and bottom walls, respectively, as in the apparatus shown in FIG. 8. An ultraviolet laser beam is emitted from a light source, not shown, situated above the deposition chamber 1 and is focused via a focusing lens 16 and window 17 toward the neighborhood of a thin film deposition spot on the substrate 3 in the deposition chamber 1. Thereafter, the beam diverges and goes out of the chamber 1 via the window 18.

With a feed gas for oxide superconductor and oxygen gas or its mixed gas fed alternately or simultaneously into the deposition chamber 1 as in the case of the aforementioned fifth embodiment, an ultraviolet laser beam 15 is focused toward the neighborhood of the substrate 3 as set forth above. At that time, the feed gas is excited in the neighborhood of the substrate 3 and, at the same time, excited oxygen is supplied to the thin film deposition site on the substrate 3. As a result, oxygen atoms are incorporated in a crystal structure of a resultant thin film to form an oxide superconductor.

In order to excite oxygen, an ultraviolet lamp may be employed in place of the ultraviolet laser beam as in the case of the aforementioned third embodiment. Furthermore, use may also be made of a vacuum ultraviolet beam of a shorter wavelength of the order of below 2000Å. A visible or infrared beam can be used to excite oxygen. Various irradiation methods can be adopted, such as irradiation by an ultraviolet beam, as in the case of the third embodiment.

In the fourth to sixth embodiments of the present invention, the pressure of the feed gas and oxygen gas in the deposition chamber 1 may be within a range of above $10^{-5}$ Torr, preferably within a range of 0.1 to 1000 m Torr and more preferably within a range of about 1 to 100 m Torr.

A seventh embodiment of the present invention will be explained below. The formation of a thin film on the substrate by an irradiation with a beam containing an oxide superconductor or particles of raw material for the oxide super conductor will be explained below.

Figure 12:
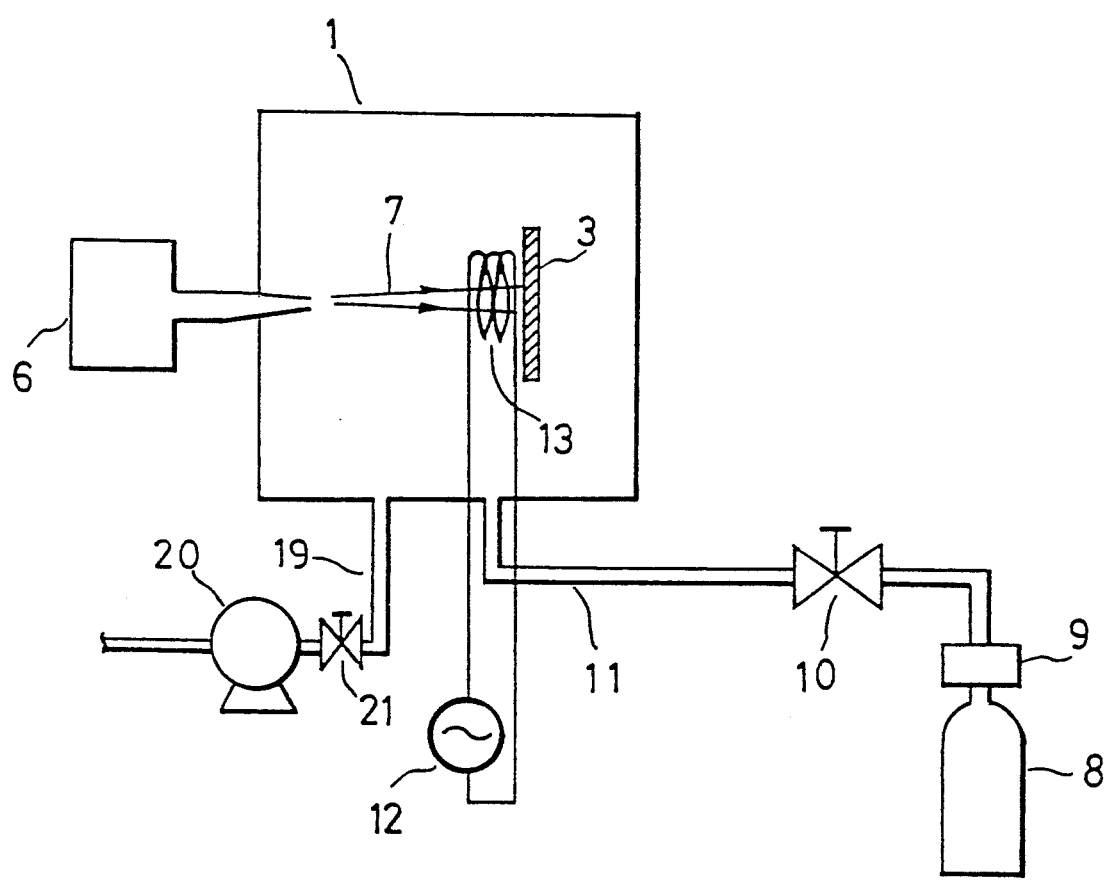

FIG. 12 is a diagrammatic view showing an arrangement of an apparatus as used in a seventh embodiment of the present invention. This apparatus is basically similar to that shown in FIG. 7. An exhaust system, oxygen gas supply system and excited oxygen-forming means in FIG. 12 are the same as those of in FIG. 7. A beam emitting device 6 is provided outside a deposition chamber 1, and a substrate 3 set in the deposition chamber 1 is irradiated with a beam which is emitted from the beam emitting device 6 and contains materials for oxide superconductor. Thus, a thin film is formed on the substrate 3.

In this case, excited oxygen is generated near the substrate 3, as in the apparatus shown in FIG. 7, due to the occurrence of a discharge resulting from the flow of electric current through a coil 13. In this way, the excited oxygen is supplied to or near a thin film deposition site on the substrate 3. As a result, oxygen atoms are incorporated in a crystal structure of a resultant thin film to form an oxide superconductor thin film on the substrate.

Even in this embodiment, the aforementioned various methods can be used, not to mention the method of the seventh embodiment, to obtain excited oxygen. The pressure of an oxygen gas in the deposition chamber 1 may be within a range of above $10^{-5}$ Torr as in the case of the first to third embodiments preferably within a range of 0.1 to 1000 m Torr and more preferably within a range of about 1 to 100 m Torr.

Even in any of the first to seventh embodiments, an oxide superconductor thin film pattern can be formed on the substrate by placing a mask pattern on a thin film deposition surface of the substrate in the deposition chamber 1. Furthermore, a superconductor thin film can be incorporated into an electronic element with the use of a semiconductor substrate, such as a silicon wafer, and can also be employed to form a wiring layer in the electronic element.

An example of the present invention will be explained below in connection with forming an oxide superconductor thin film on the substrate in accordance with the present method.

With the use of the apparatus shown in FIG. 1, an oxide superconductor thin film was formed on a substrate under the conditions (a) to (h) as set forth below:

(a) As a beam source, use was made of an excimer laser (KrF) for emitting a beam of a 248 nm in wavelength;

(b) A laser beam whose pulse width was 30 $\mu$ sec was employed with a repetition cycle of 50 Hz;

(c) The emission energy and a beam size at an irradiation surface were 300 mJ/pulse and $2 \times 3$ mm$^2$, respectively;

(d) A sintered body YBa$_2$Cu$_3$O$_7$-$\delta$ was used as a target;

(e) As the substrate, use was made of a strontium titanate (SrTiO$_3$) single crystal;

(f) The deposition chamber, while being exhausted, was supplied with an oxygen gas and argon gas to reach a pressure of 10 m Torr;

(g) Use was made of an RF power supply having an output power of 100 W and a frequency of 13.6 MHz; and (h) Excited oxygen was supplied to a thin film deposition site on the substrate.

That is, an about 0.3 $\mu$m-thick YBa$_2$Cu$_3$O$_7$-$\delta$ thin film was formed on the substrate at a critical temperature of 90 K by performing the aforementioned steps for 2 minutes.

We claim:

1. A method for manufacturing an oxide superconductor thin film, consisting essentially of the steps of:
   preparing a substrate;
   directing a beam to a target containing constituent elements of an oxide superconductor to ablate a target spot irradiated with the beam and depositing evaporated matter on said substrate;
   supplying excited oxygen to or near a thin film deposition site on said substrate during the deposition of said evaporated matter.

2. The method according to claim 2, wherein said beam is selected from the group consisting of a laser beam, electron beam, ion beam and neutral particle beam.

3. The method according to claim 1, wherein said target contains an oxide superconductor or a row material thereof.

4. The method according to claim 1, wherein said excited oxygen is produced by means of generating a discharge in a oxygen gas or oxygen-containing mixed gas.

5. The method according to claim 5, wherein said excited oxygen is blown toward or near a thin film deposition site on said substrate.

6. The method according to claim 4, wherein said excited oxygen is produced by means of generating a discharge in an oxygen gas or oxygen-containing mixed gas atmosphere in a deposition chamber and supplied to or near said thin film deposition site on said substrate.

7. The method according to claim 4, wherein said discharge is selected from the group consisting of a DC discharge, AC discharge, RF discharge and microwave discharge.

8. The method according to claim 4, wherein said discharge is generated in a pulse-like or continuous fashion.

9. The method according to claim 1, wherein said excited oxygen is produced by irradiating an oxygen gas or oxygen-containing gas with said beam.

10. The method according to claim 1 wherein said excited oxygen is produced by means of directing a light beam into an oxygen gas or oxygen-containing gas in a deposition chamber and supplied to or near a thin film deposition site on said substrate.

11. The method according to claim 10, wherein said light beam irradiates a substrate surface or its neighborhood.

12. The method according to claim 1, wherein said beam is selected from the group consisting of an ultraviolet beam, vacuum ultraviolet beam, visible beam an infrared beam.

* * * * *